Nov. 17, 1970 G. R. PETERSON ET AL 3,541,478

ELECTRICAL FILTER BODY CONSTRUCTION HAVING DEPOSITED OUTER SURFACE

Filed May 2, 1968

2 Sheets-Sheet 1

INVENTORS
GERALD R. PETERSON
JOHN F. REINKE

BY Joseph O. Bizzaro, Jr.

ATTORNEY

Nov. 17, 1970

G. R. PETERSON ET AL 3,541,478

ELECTRICAL FILTER BODY CONSTRUCTION HAVING DEPOSITED OUTER SURFACE

Filed May 2, 1968

2 Sheets-Sheet 2

INVENTORS
GERALD R. PETERSON
JOHN F. REINKE

BY Joseph D. Bizzaro, Jr.

ATTORNEY

United States Patent Office
3,541,478
Patented Nov. 17, 1970

3,541,478
ELECTRICAL FILTER BODY CONSTRUCTION HAVING DEPOSITED OUTER SURFACE

Gerald R. Peterson and John F. Reinke, Wauwatosa, Wis., assignors to Allen-Bradley Company, Milwaukee, Wis., a corporation of Wisconsin Filed May 2, 1968, Ser. No. 725,983
Int. Cl. H01h *7/14;* H05k *5/04*
U.S. Cl. 333—79 9 Claims

ABSTRACT OF THE DISCLOSURE

The construction of an electrical filter having a pair of terminals extending from the filter, a plurality of capacitive and inductive components disposed within the filter to form a filter circuit and electrically connected with one another and between the terminals, a plurality of spaced electrically conductive walls that are disposed to both sides of each inductive component to shield same, an insulating resin that encapsulates the capacitive and inductive components and fills the regions between the electrically conductive walls to form a rigid filter body, and a conductive coating upon the exterior surface of said resin that electrically joins with said walls to form a shielding enclosure that isolates each conductive component.

BACKGROUND OF THE INVENTION

This invention relates to electrical filters, and more particularly, to a body construction therefor. A typical application of such filters is for insertion between a power supply and a load circuit to block unwanted radio frequency interference from entering the load circuit.

It has been the practice in the construction of electrical filters to assemble the components inside an enclosure comprising a metal housing, and this requires an assembly technique which is costly and difficult. Frequently, the assembly of part inside an enclosure results in filters of unreliable quality.

The metal housing which is used to protect and contain a filter circuit also acts as a ground for the filter. In the construction of a filter for a circuit having inductive and capacitive components, it is especially important that each inductive component of said circuit be provided with a shielding enclosure that isolates it from the exterior of the filter as well as from any other inductive component. This is accomplished in the usual form of construction by providing spaced, metallic, electrically conductive shielding walls which are disposed on both sides of each inductive component and which are electrically connected to the exterior surface of the metal housing. Frequently, electrical filters are constructed which require some of the metal shielding walls to be positioned in the interior of the filter. In such latter cases, the shielding walls are hidden from the view of the assembler and this frequently results in defective connections between these interior shielding walls and the exterior wall or surface of the metal housing. In many cases then, conventional filter assembly techniques result in unreliable filters which lack the necessary isolation for each inductive component of the filter circuit because of the defectively connected interior shielding walls.

Conventional filter construction also typically utilizes an insulating fluid such as mineral oil to fill the void spaces within the metal housing, thus surrounding the electrical components of the filter circuit to prevent arcing and for heat transfer purposes. Leakage of this insulating fluid from the filter may destroy the effectiveness of the filter as well as create a potential fire hazard. Such leakage may occur particularly in those constructions in which the metal housing forming the enclosure for the oil is of sheet metal with at least one soldered seam, for soldered seams may develop small leaks with extended usage.

Also, conventional filter construction, in addition to causing assembly problems and not being adequately reliable, is a comparatively expensive form of construction.

The problem of providing a reliably constructed electrical filter which not only is easier to construct, but which also utilizes low cost construction materials for the most part has not been fully solved.

SUMMARY OF THE INVENTION

In the present invention there is provided an electrical filter which is more reliable, less expensive and easier to construct than filters heretofore obtainable. This is accomplished by provision of a filter comprising a pair of terminals, a plurality of capacitive and inductive components within the filter that are electrically connected with one another and between said terminals, a plurality of electrically conductive walls that are spaced from one another successively along the length of the filter and which are disposed to both sides of each inductive component to shield the same, an insulating resin which encapsulates the electrical components of the filter, fills the regions between said walls, and forms a rigid, solid body for the filter, and a conductive coating upon the exterior surface of the insulating resin that electrically joins with said walls and which forms therewith a shielding enclosure that isolates each inductive component.

Objects of the present invention are: to provide an electrical filter which is easier to construct, less expenive and more reliable than heretofore possible; to provide a filter in which an insulating resin encapsulates the electrical components of the filter and forms a rigid, solid body for the filter; to provide an electrical filter in which the exterior surface of the encapsulating insulating resin serves as a supporting substrate for the ground layer of the filter as formed by a conductive coating; to provide an electrical filter which is rigid and solid throughout; and, in general, to provide an electrical filter having the several cited features and advantages which is quite strong and readily adaptable to various filter circuit arrangements while still being relatively simple and inexpensive to manufacture and assemble. Other objects and advantages will become apparent from the following description in which there is shown by way of illustration a preferred embodiment of the invention. Reference is made to the claims at the end of this specification for a determination of the scope of the invention.

DESCRIPTION OF THE PREFERRED EMBODIMENT

Figure 1:
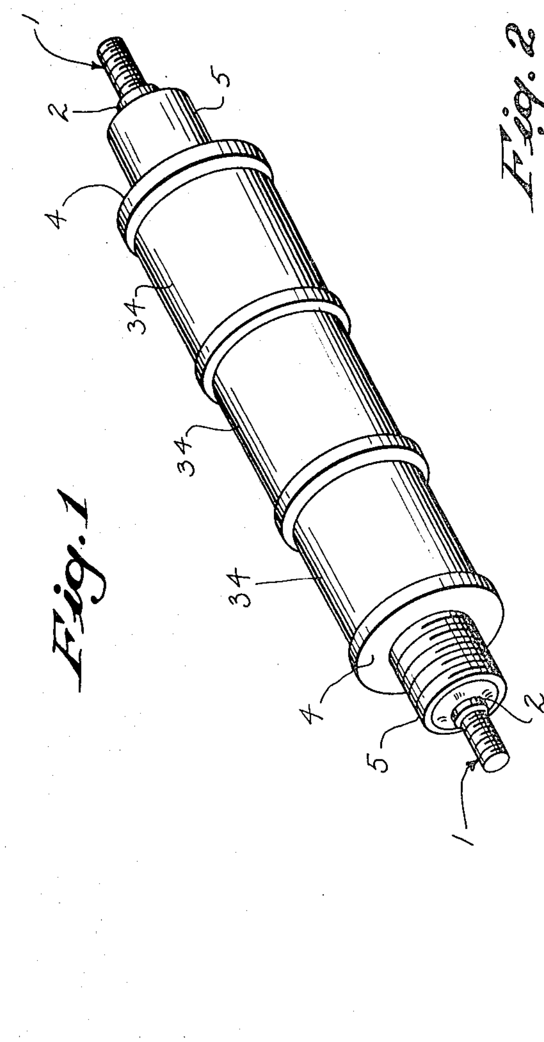
FIG. 1 is a view in perspective of an electrical filter constructed according to the invention.
Figure 2:
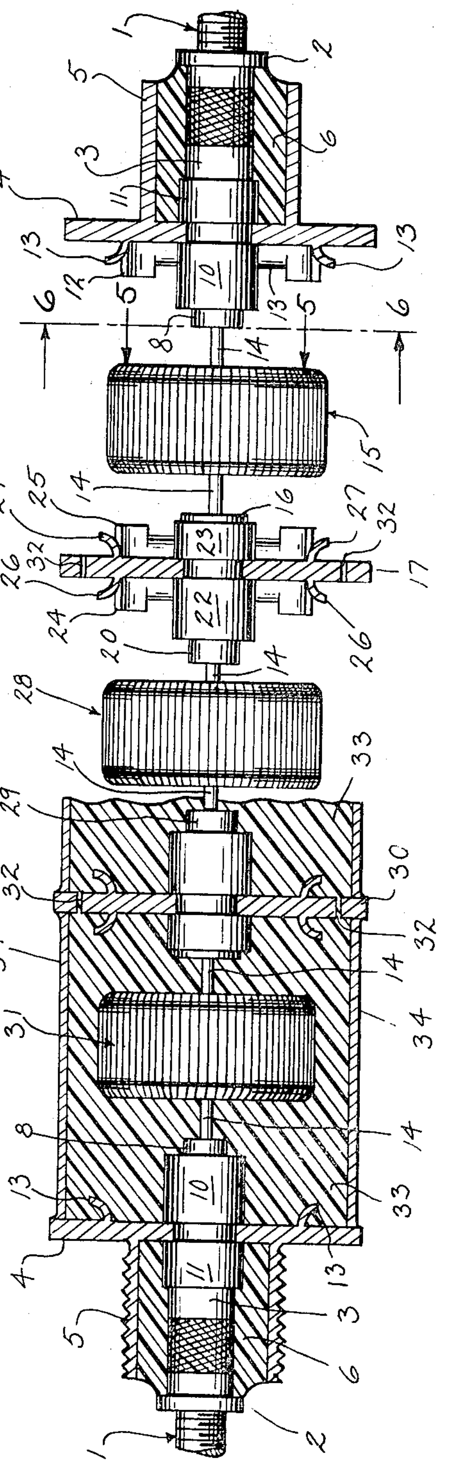
FIG. 2 is a side view of the filter of FIG. 1 that is on an enlarged scale and in section with parts broken away to show the interior.

Referring to the drawings, there is shown in FIG. 1 a generally cylindrical filter body from each end of which extends the threaded part of a terminal 1. As shown in FIG. 2, each terminal 1 extends inside the filter body and is comprised of a small collar 2 adjacent the threads and an inner end 3 which extends through a central opening in an electrically conductive, disk-shaped end wall 4 of an end cap 5. Each end cap 5 has a hollow, cylindrical part surrounding the associated terminal 1 and a suitable insulating resin 6, such as a quartz-filled epoxy, fills the annular space between the terminal 1 and the end cap 5 to lend rigidity to this part of the structure, to provide a moisture barrier between the the exterior and the interior of the filter body, and to electrically insulate the terminal 1.

Figure 3:
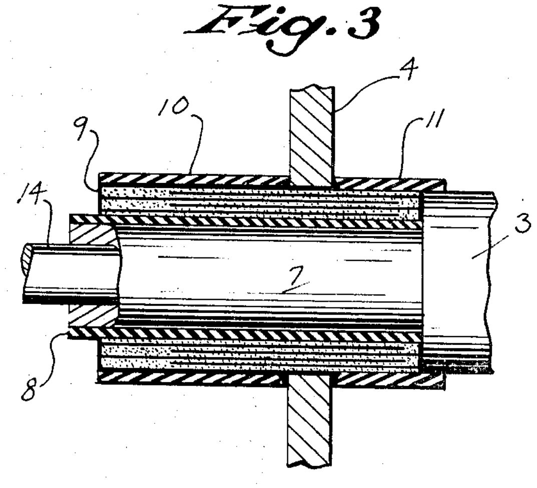
FIG. 3 is a view in section, on a still larger scale, of a portion of the filter of FIG. 2 that comprises a capacitive component and adjoining parts located at the right hand end of the filter as viewed in FIG. 2.

The construction at the inner end 3 of the right hand terminal 1 is shown in FIG. 3. The innermost part of the inner end 3 is comprised of a stepped-down seat 7 and a thin insulating sheath 8 is tightly fitted over this seat 7. A capacitor 9, comprised of concentric layers of thin electrodes separated by layers of dielectric, and in the shape of a small hollow cylinder, is disposed on the sheath 8 and is abutted against the step in the inner end 3 to make electrical contact therewith. The outer, cylindrical surface of the capacitor 9 fits closely in the central opening of the end wall 4 of the end cap 5, and an outer layer of the capacitor 9 is in electrical contact with the wall 4, the electrical junction being provided therebetween with, for example, fillets of a yieldable, highly conductive resin such as a silver-filled epoxy. Thus, the capacitor 9 is disposed electrically between the terminal 1 and the wall 4. To protect the capacitor 9, insulating sheaths 10 and 11 are fitted tightly over its outer cylindrical surface, with the sheath 10 being disposed on one side of the wall 4 and the sheath 11 on the opposite side. The sheaths 10 and 11 function as a conformal coating for the protection and insulation of the capacitor 9 and can be made of heat shrunk plastic tubing, for example, heat shrunk tubing of a vinylidine fluoride polymer.

Figure 6:
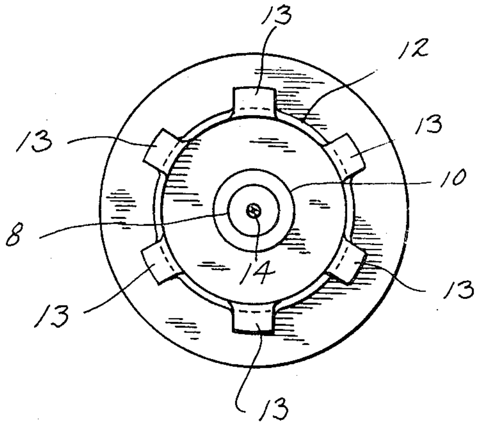
FIG. 6 is a view on the same scale as FIG. 2 showing an electrically conductive end wall that is viewed through the plane 6—6 depicted in FIG. 2.

Referring back to FIG. 2, the inside face of the end wall 4 has an anchor ring 12 of somewhat complex configuration with bent ears 13 for the purpose of forming a tight union with an insulating resin to be described hereinafter. The anchor ring 12 is shown in FIG. 6 from an end thereof, and it is an integral part of the end cap 5. To attain the unique configuration of the end cap 5 in a single, unitary piece, it is preferably molded from an electrically conductive metal, such as silver-plated brass, or advantageously from a moldable plastic or resin which is capable of being metal plated as described hereinafter.

The capacitor 9 is also in electrical engagement with a conductor wire 14 that extends from and is electrically connected to a central opening in the right hand terminal 1. This connection can be seen best in FIG. 3.

Figure 5:
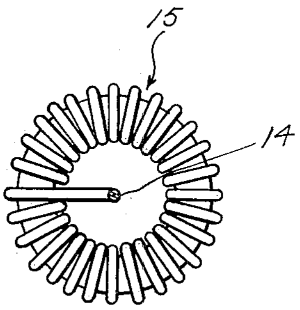
FIG. 5 is a view on the same scale as FIG. 2 showing a ring-type inductive component of the filter that is viewed through the plane 5—5 depicted in FIG. 2.

Referring back to FIG. 2, the conductor wire 14 extends from the right hand terminal 1 and is wound about a ring of suitable insulating material to form a right hand inductive component 15. FIG. 5 shows the construction of the inductive component 15 as seen from its end.

Figure 4:
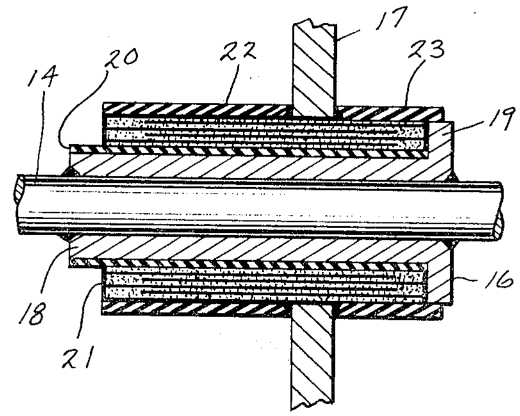
FIG. 4 is a view in section on the same scale as FIG. 3 of another portion of the filter of FIG. 2 that comprise a capacitive component and adjoining parts disposed to the left of the capacitive component of FIG. 3.

As can be seen in FIG. 2, the conductor wire 14 extends from the inductive component 15 to a right hand interior eyelet 16 with which it is electrically connected. The eyelet 16 extends through a central opening in a disk-shaped, electrically conductive, right hand interior wall 17. Referring now to FIG. 4, the eyelet 16 has a hollow cylindrical shank 18 for inserting the wire 14, and a flange 19 at its right hand end. An insulating sheath 20, similar to the sheath 8, is tightly fitted over the shank 18. A first interior capacitor 21 in the shape of a small hollow cylinder is disposed on the sheath 20 and is abutted against the inside surface of the flange 19 to make electrical contact therewith. This capacitor 21 is similar to the capacitor 9, and is comprised of concentric layers of thin electrodes separated by layers of dielectric. The outer cylindrical surface of the capacitor 21 fits closely in the central opening of the interior wall 17, and an outer layer of the capacitor 21 is in electrical contact with the wall 17 in much the same manner as the outer layer of the capacitor 9 is in electrical contact with the end wall 4. Thus, the capacitor 21 is disposed electrically between the right hand inductive component 15 and the right hand interior wall 17. To physically protect the capacitor 21, insulating sheaths 22 and 23, similar to sheaths 10 and 11, are fitted tightly over it, with the sheath 22 being disposed on one side of the wall 17 and the sheath 23 on the opposite side.

Referring back to FIG. 2, it is seen that the inductive component 15 is disposed electrically between the right hand end wall 4 and the right hand interior wall 17. Each of the faces of the interior wall 17 has an anchor ring, 24 and 25 respectively, of complex configuration with bent ears 26 and 27 respectively for the purpose of forming a tight union with an insulating resin to be described hereinafter, the configuration being similar to that of the ring 12 and the bent ears 13 on the inside face of the end wall 4. The unique configuration of the interior wall 17 is attained in a manner similar to that described for the end cap 5.

As shown in FIG. 2, the conductor wire 14 extends from the right hand interior eyelet 16 to a central inductive component 28, which is similar to the right hand inductive component 15. From the central inductive component 28 the conductor 14 extends to a left hand interior eyelet 29 which is a mirror image of the right hand interior eyelet 16. The eyelet 29 extends through a central opening in a left hand interior wall 30 which is a mirror image of the right hand interior wall 17. Thus, it can be seen that the central inductive component 28 is disposed electrically between the right hand interior wall 17 and the left hand interior wall 30.

Still referring to FIG. 2, the conductor wire 14 leads from the left hand interior eyelet 29 to a left hand inductive component 31, which also is similar to the right hand inductive component 15. From the left hand inductive component 31, the conductor wire 14 extends to and is electrically connected with the left hand terminal 1, the construction of which is similar to the right hand terminal 1 described heretofore. The left hand terminal 1 extends through a central opening in the left hand end wall 4 of a left hand end cap 5, the construction of each of these being similar to that for the right hand wall 4 and end cap 5, except that the hollow, cylindrical part of the left hand end cap 5 surrounding the associated terminal 1 is threaded to provide for mounting the filter and forming a ground connection. Thus, it can be seen that the left hand inductive component 31 is disposed electrically between the left hand end wall 4 and the left hand interior wall 30.

As can be seen further in FIG. 2, the electrically conductive walls including the end walls 4, and the interior walls 17 and 30, are spaced from one another successively along the length of the filter body and are disposed to both sides of each inductive component 15, 28 and 31 in order to shield the same, and also serving to compartmentalize or subdivide the interior of the filter body when more than one inductive component is included in the filter circuit. Each wall is provided with a central opening through which the filter circuit extends. It is intended that this central opening can be located at any point within the perimeter of each wall. Additionally, the interior walls can be provided with a plurality of perforations 32 as shown in FIG. 2 which extend through the faces thereof. The perforations 32 can offer additional anchoring means for the filter body since a rod of a rigid, solid insulating resin to be described later will form therein to connect successive compartments of the filter body.

Also, the perforations 32 can permit pressure equalization between successive compartments within the filter body where such insulating resin is molded under pressure. However, if the interior walls are provided with perforations, care should be taken that such perforations be made small enough to insure that the interior walls can act effectively as a shield for the inductive components.

The interior walls 17 and 30, in a manner similar to the end walls 4 of the end caps 5, can be made of an electrically conductive metal such as silver-plated brass or, preferably, of an electrically conductive metal-plated plastic or resin. Examples of the latter includes synthetic polyamides or thermoset resins capable of being metal-plated such as a glass fiber reinforced epoxy, and provided with a continuous layer of copper deposited thereon by means of electroless plating techniques such as known to the art, followed by a continuous layer (having a thickness of 1.5 mils, for example) of electrolytic nickel deposited on top of the copper layer.

An insulating resin 33 encapsulates the electrical components of the filter, filling the regions between the end and interior walls and forming a rigid, solid, physically strong body for the filter. Both castable and moldable insulating resins can be used including, for example, moldable thermoset resins suitable for low stress, low temperature molding such as an epoxy. The insulating resin 33 advantageously can be cast or molded after the relatively simple and open assembly of the interior parts of the filter described in the foregoing paragraphs has been completed. The capacitors of the filter can also be provided with supplemental environmental protection by first coating them with an insulating resin of high bond strength and low gas and liquid permeability, such as an epoxy resin of those characteristics, prior to casting or molding the insulating resin 33 that forms the body of the filter.

Referring to FIG. 2, the exterior surface of the insulating resin 33 acts as a supporting substrate for a conductive coating 34 which is deposited thereon as a continuous layer. This coating 34 electrically joins the end and interior walls of the filter with one another thereby providing an electrically shielded enclosure (from the exterior of the filter) for the interior parts of the filter, and also acting as a ground when the filter is mounted for use. Additionally, the end and interior walls provide separate, individual shielding for each inductive component in the filter cricuit, and combine with the coating 34 to isolate each inductive component. The coating 34 can be provided, for example, by a continuous layer of electroless copper or electroless nickel on the exterior surface of the resin 33 followed by a continuous layer of electrolytic nickel (e.g., 1.5 mils thick) or pure silver plate (e.g., 11 mills thick) deposited on top of the electroless metal layer. The coating 34 can also be a continuous layer of a conductive resin such as a conductive epoxy (e.g., silver mixed in an epoxy matrix) which is painted on or otherwise applied to the exterior surface of the resin 33; or, it can be a thin, continuous layer of conductive resin followed by a continuous layer of electrolytic nickel (e.g., 1.5 mils thick) deposited on top of the thin conductive resin layer. It is important that the resistance of said conductive coating be very small so as not to impair the electrical attenuation of the filter, and that the thickness thereof be sufficiently large to provide a shielding enclosure.

In the present invention, a filter is provided that can be constructed with a simple, inexpensive and highly reliable open assembly technique by using an insulating resin to encapsulate the electrical components of the filter after they are first assembled, and to form a rigid, solid body for the filter. The exterior surface of the rigid, solid insulating resin acts as a supporting substrate for a conductive coating, which in turn, acts as a ground for the filter and as a shielding enclosure for the interior parts of the filter. The electrical components of the filter circuit can be so constructed and arranged as to provide a simple and highly reliable connection to said coating. In addition to high reliability and the use of less expensive construction materials in the assembly of the filter according to the present invention, the fact that the filter body is solid eliminates any possibility of a hazardous failure caused by leakage of an insulating oil, which is usually used in conventional, hollow filter body construction.

It is fully contemplated that a filter can be constructed according to this invention that contains only a single inductive component. Further, although the overall configuration of the filter shown in the drawings is cylindrical, such configuration is not critical, and thus other shapes can be used such as one having a generally rectangular cross section. Also, it is contemplated that filter circuit arrangements other than the particular one shown in the drawings can be used in the construction of a filter according to this invention.

Although a specific structural form of this invention has been illustrated and described, the invention is not limited to the specific construction herein disclosed and it is expected that those skilled in the art may be able to devise changes in or alternatives to the disclosed structural features while still practicing this invention. It is to be understood, therefore, that it is intended to cover all changes and modifications of the illustrated embodiment of this invention herein disclosed, as well as other embodiments not which do not constitute a departure from the true spirit and scope of this invention.

We claim:

1. In an electrical filter body the combination comprising:

- a pair of terminals extending from the filter;
- a plurality of capacitive and inductive components within the filter electrically connected with one another and between said terminals;
- a plurality of electrically conductive walls that are spaced from one another successively along the length of the filter and which are disposed to both sides of each inductive component to shield the same;
- an insulating resin encapsulating the electrical components of the filter, filling the regions between said walls, and forming a rigid, solid body for the filter the outer extent of such resin at the region alongside the walls leaving the peripheral edges of the wall exposed outward beyond the resin to have such peripheral edges form a part of an outer conductive surface of the filter body; and
- a conductive coating deposited upon the exterior surface of said resin that follows the contour of the resin surface and the peripheral edges of the wall to electrically join with said walls and to form with the walls a shielding enclosure that isolates each inductive component.

2. The combination of claim 1 wherein the electrically conductive walls comprise end walls and interior walls with each interior wall provided with a plurality of perforations extending through the face thereof.

3. The combination of claim 1 wherein the electrically conductive walls are made of a metal-plated plastic material.

4. The combination of claim 1 wherein the electrically conductive walls are each provided with integral anchoring means on at least one face thereof that is buried within said insulating resin.

5. In an electrical filter body the combination comprising:

- electrically conductive end walls having electrical shielding properties disposed at opposite ends of the filter body and having central openings therein;
- interior walls having central openings therein disposed between the end walls and spaced from one another and the end walls to compartmentalize the interior of the filter body, said interior walls being electrically conductive with electrical shielding properties;

a filter circuit extending through said filter body that includes capacitive and inductive circuit components and connections therebetween, said filter circuit passing through the openings of said end walls and said interior walls;

said capacitive components being disposed at the central openings of said end and interior walls with an outer layer of each such component being electrically connected to the associated wall;

said inductive components being disposed between the walls to be separated from one another thereby;

an insulating resin filling the regions between said walls, an encapsulating the electrical components of the filter, and forming a rigid, solid body for the filter the outer extent of such resin at the region alongside the walls leaving the peripheral edges of the walls exposed outward beyond the resin to have such peripheral edges form a part of an outer conductive surface of the filter body; and a conductive coating deposited upon the exterior surface of said resin that follows the contour of the resin surface and the peripheral edges of the walls to electrically join said end and interior walls and to form with such walls a shielding enclosure that isolates said inductive components from one another and from the exterior of the filter body.

6. The combination of claim 5 wherein the electrically conductive walls are made of a metal-plated plastic material.

7. The combination of claim 5 wherein the electrically conductive walls are provided with integral anchoring means on at least one face thereof.

8. The combination of claim 5 wherein the conductive coating comprises a continuous layer of an electrically conductive metal plate.

9. The combination of claim 5 wherein the conductive coating comprises a continuous layer of electrically conductive resin.

References Cited

UNITED STATES PATENTS

| | | | |
|---|---|---|---|
| 1,385,624 | 7/1921 | Kent | 336—61 |
| 2,163,775 | 6/1939 | Conklin. | |
| 2,221,105 | 11/1940 | Otto | 333—79 |
| 2,259,234 | 10/1941 | Voigt | 317—260 X |
| 2,485,913 | 10/1949 | Osterman | 317—260 |
| 2,491,681 | 12/1949 | Minter | 333—79 |
| 2,506,971 | 5/1950 | Robinson | 336—90 X |
| 2,537,108 | 1/1951 | Wagner et al. | 336—96 X |
| 2,638,523 | 5/1953 | Rubin | 174—52.6 |
| 2,718,506 | 9/1955 | Elleman. | |
| 2,832,012 | 4/1958 | Kleason et al. | 336—96 X |
| 2,918,635 | 12/1959 | Schenker | 333—79 |
| 3,129,396 | 4/1964 | Germain et al. | 333—79 X |
| 3,302,081 | 1/1967 | Grahame | 317—256 |
| 3,439,231 | 4/1969 | Booe | 174—52.6 X |

OTHER REFERENCES

NBS, "NBS Casting Resin," Nat. Bureau of Standards, Technical News Bulletin, vol. 31, #7, July 1947, pp. 78–80.

Rountree, J. G., "A $5 Low-Pass Filter," Radio & TV News, June 1953, pp. 47–48.

Frederick, "Radio Frequency Interference," vol. 3, Chapt. 4, Secs. 1.2.4–1.2.5, pp. 4–28—4–34.

Frederick Research Corp, Wheaton, Md., TK 6553 F68, 1962.

HERMAN KARL SAALBACH, Primary Examiner

W. H. PUNTER, Assistant Examiner

U.S. Cl. X.R.

333—70; 174—52.6; 336—96